United States Patent
Schrijver et al.

(10) Patent No.: US 6,707,530 B2
(45) Date of Patent: Mar. 16, 2004

(54) LITHOGRAPHIC APPARATUS, DEVICE MANUFACTURING METHOD, AND DEVICE MANUFACTURED THEREBY

(75) Inventors: Raymond Laurentius Johannes Schrijver, Eindhoven (NL); Tjarko Adriaan Rudolf Van Empel, Eindhoven (NL); Marcel Koenraad Marie Baggen, Nuenen (NL)

(73) Assignee: ASML Netherlands B.V., Veldhoven (NL)

(*) Notice: Subject to any disclaimer, the term of this patent is extended or adjusted under 35 U.S.C. 154(b) by 89 days.

(21) Appl. No.: 10/138,506

(22) Filed: May 6, 2002

(65) Prior Publication Data
US 2002/0180940 A1 Dec. 5, 2002

(30) Foreign Application Priority Data
May 9, 2001 (EP) ............................................. 01304164

(51) Int. Cl.⁷ ...................... G03B 27/52; G03B 27/42; G03B 27/54
(52) U.S. Cl. .............................. 355/30; 355/53; 355/67
(58) Field of Search ............................... 355/30, 53, 67, 355/73, 76

(56) References Cited

U.S. PATENT DOCUMENTS

| | | | |
|---|---|---|---|
| 5,997,963 A | | 12/1999 | Davison et al. |
| 6,337,161 B2 | * | 1/2002 | Chiba et al. ............... 430/5 |
| 6,445,440 B1 | * | 9/2002 | Bisschops et al. ............ 355/53 |
| 6,542,220 B1 | * | 4/2003 | Schrijver et al. ............ 355/53 |
| 6,614,504 B2 | * | 9/2003 | Aoki et al. ............... 355/30 |
| 2002/0085183 A1 | * | 7/2002 | Wu et al. ................. 355/30 |
| 2002/0145711 A1 | * | 10/2002 | Magome et al. ............. 355/30 |
| 2002/0159042 A1 | * | 10/2002 | Poon .................... 355/53 |
| 2003/0038929 A1 | * | 2/2003 | Tokuda et al. ............. 355/30 |

FOREIGN PATENT DOCUMENTS

| | | |
|---|---|---|
| EP | 0 532 968 A1 | 3/1993 |
| EP | 1 052 551 A2 | 11/2000 |
| WO | WO 99/57607 | 11/1999 |

* cited by examiner

Primary Examiner—Rodney Fuller
(74) Attorney, Agent, or Firm—Pillsbury Winthrop LLP

(57) ABSTRACT

A lithographic apparatus has an inner purge compartment surrounding and moving with a moveable component such as a mask table or a substrate table and an outer purge compartment surrounding the inner purge compartment. Purge gas is supplied to the inner compartment and exhausted from the outer compartment so that the inner purge compartment is at an average pressure higher than ambient and the outer compartment is at a pressure lower than ambient. Even when acceleration of the moveable object and compartments cause local pressure variations, the inner compartment is at a higher pressure than the outer compartment so that any gas flow is outward and contamination is prevented from reaching the inner compartment.

10 Claims, 2 Drawing Sheets

LITHOGRAPHIC APPARATUS, DEVICE MANUFACTURING METHOD, AND DEVICE MANUFACTURED THEREBY

BACKGROUND OF THE INVENTION

1. Field of the Invention

The present invention relates to a lithographic projection apparatus.

2. Description of the Related Art

As used herein the term "patterning device" should be broadly interpreted as referring to a device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The use of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

Another example of a pattering device is a programmable mirror array. One example of such an array is a matrix-addressable surface having a viscoelastic control layer and a reflective surface. The basic principle behind such an array is that addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described above, the patterning device can comprise one or more programmable mirror arrays. More information on mirror arrays can be seen, for example, from U.S. Pat. Nos. 5,296,891 and 5,523,193, and PCT patent applications WO 98/38597 and WO 98/33096, which are incorporated herein by reference. In the case of a programmable mirror array, the support structure may be embodied as a frame or table, for example, which may be fixed or movable as required.

A still further example of a patterning device is a programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning devices as hereabove set forth.

Lithographic projection apparatus can be used, for example, in the manufacture of integrated circuits (IC). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory procedures may be carried out on one or more tables while one or more other tables are being used for exposures. Dual stage lithographic apparatus are described, for example, in U.S. Pat. No. 5,969,441 and WO 98/40791, incorporated herein by reference.

In a lithographic apparatus, it is common to purge the beam path and the vicinity of the mask and substrate to provide a controlled atmosphere, the aim being to prevent contamination of the mask and substrate and scattering of the projection beam by dust particles and also to provide a constant and consistent atmosphere for interferometric measuring devices which measure the position of the substrate and mask tables. Where the projection beam is of a short wavelength, for example 157 nm or 126 nm, having a relatively high absorption in air, the gas used for the purge may be nitrogen of high purity. Suitable compositions of such a purge gas are disclosed in EP-1 172 698-A, which document is hereby incorporated by reference. Apparatus using nitrogen to purge the beam path and mask or substrate stages are particularly sensitive to leakage of air into the controlled atmosphere since this will result in a change in refractive index, disturbing the interferometric sensors.

In some arrangement using gases to control contamination, nested compartments may be provided with the innermost compartment containing the component to be protected at a higher pressure, for example as shown in WO 99/57607. This ensures that any leakage is away from the component to be protected. Conversely, in vacuum systems, it is known to have a series of compartments with the inner compartment at lower pressures, see for example EP-1 052 551-A2 and EP-0 532 968-A1. This reduces the pressure differentiates across, and hence forces on, vulnerable parts of the vacuum compartment, e.g. windows.

To reduce the consumption of purge gas, which is expensive due to its purity, in particular in scanners, it has been proposed to provide compartments around the mask and/or substrate tables which move with the respective table as the table scans. This avoids the need to purge a larger compartment encompassing the entire range of movement of the table. Such moveable purge compartments are disclosed in EP-1 098 225-A, which document is hereby incorporated by reference. To prevent contamination by leaks of external air into the purge compartment, the purge compartment is maintained at slight over-pressure, e.g. of a few Pa, relative to the remainder of the apparatus.

However, in a scanner, the mask and substrate tables are moved at high velocities and with high accelerations. During both acceleration and constant velocity movement, the pressure within a moving purge chamber is not uniform or constant. In particular, at the leading edge of the chamber significant pressure drops can occur leading to this part of the purge compartment being at a lower pressure than the rest of the apparatus so that inward leaks are possible. Conversely, the pressure at the trailing edge can rise substantially leading to increased leakage of purge gas into the vicinity of the beam paths of the interferometric measuring devices disturbing the reflective index there.

SUMMARY OF THE INVENTION

It is an object of the present invention to provide a moveable purge compartment in which inward and/or outward leakage is avoided or reduced even when the purge compartment is undergoing large accelerations or moving at high velocity.

This and other objects are achieved according to the invention in a lithographic projection apparatus including a radiation system for supplying a projection beam of radiation; a support structure for supporting patterning device, the patterning device serving to pattern the projection beam according to a desired pattern; a substrate table for holding a substrate; a projection system for projecting the patterned beam onto a target portion of the substrate; and a first compartment at least partially enclosing and moving with a moveable component of said apparatus; and a second compartment at least partially enclosing and moving with said first compartment and a purge gas system for supplying purge gas to said first compartment and removing purge gas from said second compartment such that said first compartment is, in use, at an average pressure $P_1$, said second compartment is, in use, at an average $P_2$, whereby the pressures $P_1$, $P_2$ satisfy the inequalities: $P_1 > P_0$ and $P_2 < P_0$, where $P_0$ is the pressure of the environment exterior to the second compartment.

Even when acceleration of the moveable object and compartments cause local pressure variations, the first or inner compartment is at a higher pressure than the second or outer compartment so that any gas flow is outward and contamination is prevented from reaching the inner compartment. Also, the second compartment can be maintained at a lower pressure than the remainder of the apparatus, particularly the beam paths of any interferometric displacement measuring devices, so that leakage of purge gas to disturb these devices is minimized.

Preferably, the depth of the second compartment is substantially equal to that of the first compartment so that pressure variations caused by movements are the same in the two compartments. Isolation of the inner compartment can be further improved by providing a plurality of second compartments nested about the first compartment. In such an arrangement, the pressure of the outermost second compartment is preferably lowest.

According to a further aspect of the invention there is provided a device manufacturing method using a lithographic apparatus, the method including providing a substrate that is at least partially covered by a layer of radiation sensitive material; providing a projection beam of radiation using a radiation system; using patterning device to endow the projection beam with a pattern in its cross-section; projecting the patterned beam of radiation onto a target portion of the layer of radiation-sensitive material, providing a first compartment at least partially enclosing and moving with a moveable component of said apparatus; providing a second compartment at least partially enclosing and moving with said first compartment; and supplying purge gas to said first compartment and removing purge gas from said second compartment such that said first compartment is at an average pressure $P_1$ and said second compartment is at an average pressure $P_2$; whereby the pressures $P_1$, $P_2$ satisfy the inequalities $P_1 > P_0$ and $P_2 < P_0$, where $P_0$ is the average pressure of the environment exterior to said second compartment.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. One of ordinary skill in the art will appreciate that, in the context of such alternative applications, any use of the terms "reticle", "wafer" or "die" in this text should be considered as being replaced by the more general terms "mask", "substrate" and "target portion", respectively.

In the present document, the terms radiation and beam are used to encompass all types of electromagnetic radiation, including ultraviolet radiation (e.g. with a wavelength of 365, 248, 193, 157 or 126 nm) and EUV (extreme ultraviolet radiation, e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Figure 1:
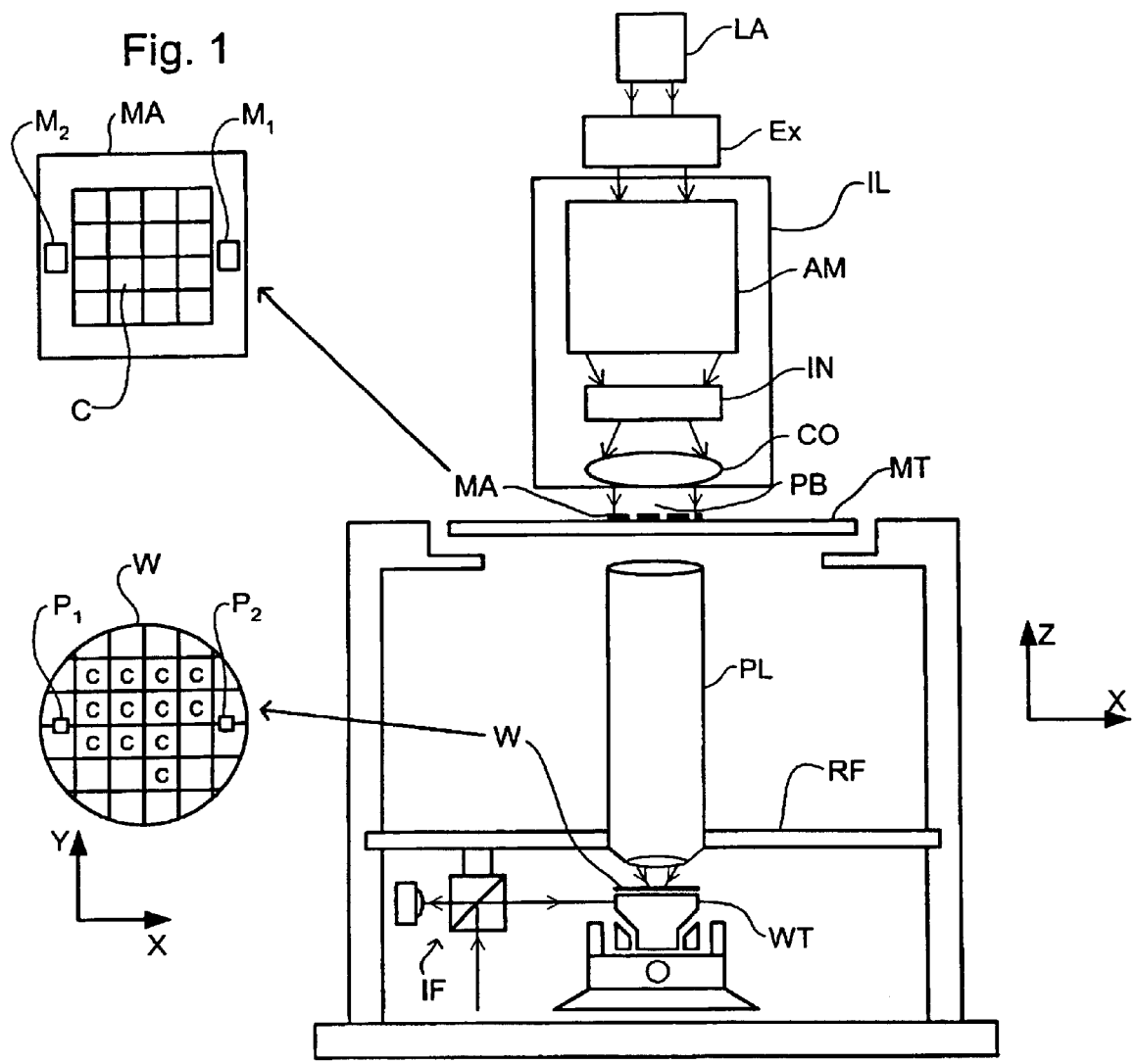
FIG. 1 depicts a lithographic projection apparatus according to an embodiment of the invention.

FIG. 1 schematically depicts a lithographic projection apparatus according to a particular embodiment of the invention. The apparatus includes a radiation system Ex, IL, for supplying a projection beam PB of radiation (e.g. UV radiation of 157 nm or 126 nm). The radiation system also includes a radiation source LA; a first object table (mask table) MT provided with a mask holder to hold a mask MA (e.g. a reticle), and connected to first positioning devices $M_1$ and $M_2$ that accurately positioning the mask with respect to a projection system (lens) PL supported by a reference frame RF; a second object table (substrate table) WT provided with a substrate holder to hold a substrate W (e.g. a resist-coated silicon wafer), and connected to second positioning devices $P_1$ and $P_2$ that accurately positioning the substrate with respect to a projection system PL; the projection system PL (e.g. a refractive lens system) for imaging an irradiated portion of the mask MA onto a target portion C (e.g. comprising one or more dies) of the substrate W.

As here depicted, the apparatus is of a transmissive type (i.e. has a transmissive mask). However, in general, it may also be of a reflective type, for example with a reflective mask. Alternatively, the apparatus may employ another kind of patterning device, such as a programmable mirror array of a type as referred to above.

The source LA (e.g. an excimer laser) produces a beam of radiation. This beam is fed into an illumination system (illuminator) IL, either directly or after having traversed a conditioning device, such as a beam expander Ex, for example. The illuminator IL may comprise an adjusting device AM that sets the outer and/or inner radial extent (commonly referred to as σ-outer and σ-inner, respectively) of the intensity distribution in the beam. In addition, it will generally comprise various other components, such as an integrator IN and collimating optics (condenser) CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors). This latter scenario is often the case when the source LA is an excimer laser. The present invention encompasses both of these scenarios.

The beam PB subsequently intercepts the mask MA, which is held on the mask table MT. Having traversed the mask MA, the beam PB passes through the lens PL, which focuses the beam PB onto a target portion C of the substrate W. With the aid of the second positioning devices $P_1$ and $P_2$ (and interferometer IF), the substrate table WT can be moved accurately, e.g. so as to position different target portions C in the path of the beam PB. Similarly, the first positioning devices $M_1$ and $M_2$ can be used to accurately position the mask MA with respect to the path of the beam PB, e.g. after mechanical retrieval of the mask MA from a mask library, or during a scan. In general, movement of the object tables MT, WT will be realized with the aid of along-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected at once (i.e. a single flash onto a target portion C). The substrate table WT is then shifted in the x and/or y directions so that a different target portion C can be irradiated by the beam PB;

2. In scan mode, essentially the same scenario applies, except that a given target portion C is not exposed in a single flash. Instead, the mask table MT is movable in a given direction (the so-called scan direction, e.g. the y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
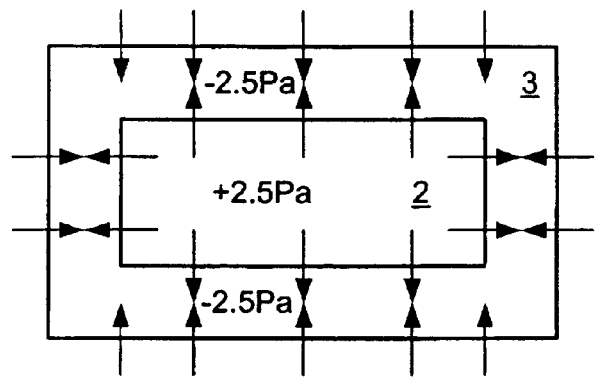
FIG. 2 shows pressure levels in and around a purge compartment according to the present invention at rest.
Figure 3:
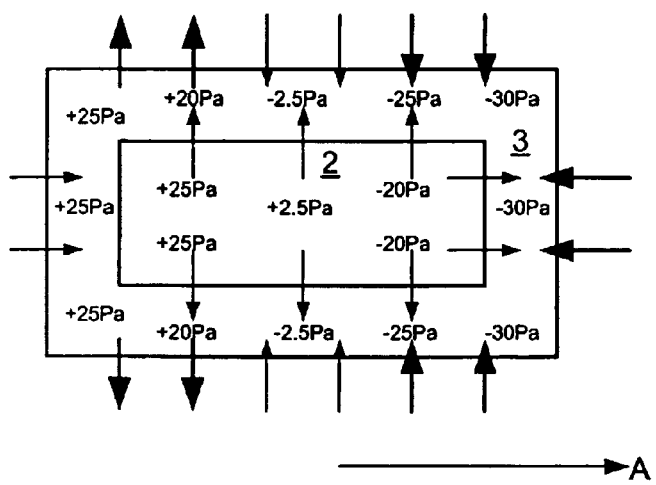
FIG. 3 shows pressure levels in and around a purge compartment according to the present invention whilst undergoing acceleration.

FIGS. 2 and 3 illustrate the principle of the purge compartment of the present invention. The inner purge compartment 2 is surrounded at least partially by an outer compartment 3, which may be regarded as a moat. Relative to the remainder of the apparatus, which has a certain pressure but is shown as being at a pressure of 0 Pa, the inner purge compartment 2 is maintained at an average overpressure of, for example, +2.5 Pa whilst the outer purge compartment 3 is maintained at an average under pressure of, for example, −2.5 Pa. This can be achieved by arranging for the supply of purge gas to be directed into the inner purge compartment 2 and for the exhaust to be taken from the outer purge compartment 3. With this arrangement, any leakage between the inner and outer purge compartment will flow from the inner to the outer purge compartment whilst any leakage of air from the exterior to the outer purge compartment will be prevented from reaching the inner purge compartment. Note that the "exterior" in this context may be the interior of a cabinet of the lithographic apparatus or the clean room in which the apparatus is located.

When the purge compartments are at rest, the pressures in the inner and outer purge compartments will be uniform, as shown in FIG. 2. Acceleration however causes pressure variations within the moving compartments, as shown in FIG. 3 which illustrates the case where the purge compartments are accelerating in the direction indicated by the arrow A. When the purge compartments are accelerating, there will be a local decrease, possibly of 25 Pa or more, in pressure at the leading side of the moving compartments and a local increase, also possibly of 25 Pa or more, at the trailing side. However, the present invention prevents the local pressure drop from resulting in leakage into the inner compartment because the pressure changes in the inner and outer purge compartments 2, 3 will be substantially the same. Thus the pressure differential between inner and outer purge compartments 2, 3 is maintained locally even when the local pressure variations within the compartments are much greater than the pressure differential. The drop in pressure at the leading side of the outer purge compartment is likely to lead to the outer compartment being locally at a lower pressure that the exterior so that there may be local leakage into the outer purge compartment 3. However, the resultant contamination is exhausted from the outer purge compartment and does not reach the inner purge compartment 2.

Figure 4:
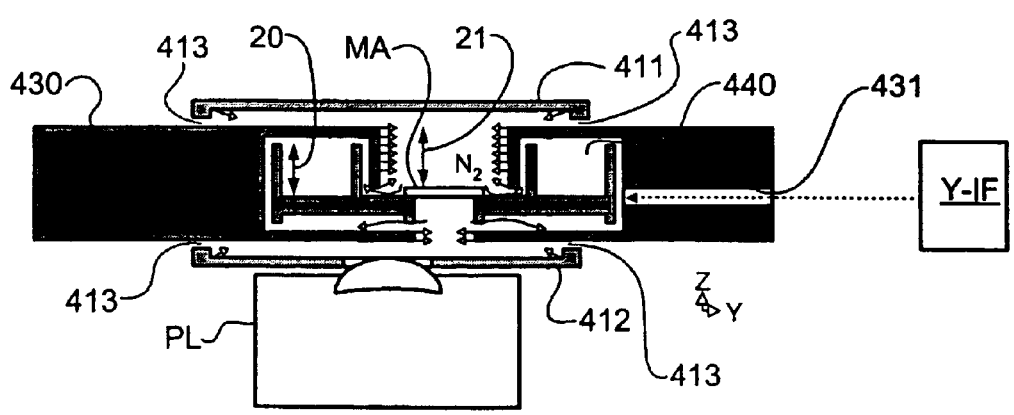
FIG. 4 is a cross-section of the mask stage of the apparatus of FIG. 1.

FIG. 4 shows how the inner and outer purge compartments are incorporated into the mask stage of the apparatus of FIG. 1, however it will be appreciated that the present invention may also be implemented in the substrate stage(s) or around any other moving part of the lithographic apparatus.

As shown in FIG. 4, the short-stroke frame 430 of the mask stage forms a partially-open, moving purge-box which is closed by fixed supply and exhaust bins 411, 412 and surrounds the chuck 440. The short-stroke frame 430 is driven to scan by a long-stroke drive (not shown) whilst the chuck 440 is supported from the short-stroke frame 430 by vertical actuators (not shown) and makes small movements in all degrees of freedom. The upper bin 411 is fixed with respect to the illumination system IL and provides purge gas to the inner compartment above the mask MA. This gas flows outwardly past restrictions between the short-stroke frame 430 and chuck 440 and is exhausted upwardly from above the sides of the chuck 440 by exhausts (not shown). Lower bin 412 is similarly fixed relative to projection lens PL and exhausts gas from around the first element of the projection system PL so as to purge the space below the mask MA.

The partially-open box provided by the short-stroke frame 430 leaves one side of the chuck 440 free so that it can be measured directly by the beams from the X-interferometer (not shown) and a bore 431 is provided in one side of the short-stroke frame 430 to allow the beam from the Y-interferometer Y-IF through to the chuck 440.

Since the short-stroke frame 430 will move relative to the upper and lower supply and exhaust bins 411, 412, gas bearings 413 are provided in the upper and lower supply and exhaust bins 411, 412. The gas bearings 413 can be pre-stressed by a pressure differential between ambient air and the inner purge compartment, magnetically, by additional vacuum areas or using additional mass, for example.

As can be seen in FIG. 4, the inner purge compartment 2 surrounds the mask MA and is itself surrounded by the outer purge compartment 3 which is formed as a channel in the chuck 440. The pressure in the outer purge compartment is kept lower than that of the inner purge compartment by the exhausts which are located above it. So that the pressure variations in the outer compartment are as close as possible to those in the inner compartment, the depth 20 of the channel forming the outer compartment 3 is made to be as close as possible to the depth 21 of the well forming the inner compartment 2. It should be kept in mind that whilst only a single outer compartment is shown in FIG. 4, a plurality of concentric channels can be provided to form a plurality of nested outer compartments. Such an arrangement would provide additional protection against contamination. Preferably the outermost of any such plurality of second compartments would have the lowest pressure, with pressure increasing towards the inner compartment. It should also be noted that not all of the nested second compartments need have a pressure lower than the exterior but all should have a pressure lower than the first compartment.

Whilst specific embodiments of the invention have been described above, it will be appreciated that the invention may be practiced otherwise than as described. The description is not intended to limit the invention.

What is claimed is:

1. A lithographic projection apparatus, comprising:
   a first compartment at least partially enclosing and moving with a moveable component of said apparatus;
   a second compartment at least partially enclosing and moving with said first compartment; and
   a purge gas system for supplying purge gas to the first compartment and removing purge gas from the second compartment such that the first compartment is, in use, at an average pressure $P_1$, the second compartment is, in use, at an average pressure $P_2$, whereby the pressures $P_1$, $P_2$ satisfy the inequalities:

$$P_1 > P_0$$

and $$P_2 < P_0$$

wherein $P_0$ is the pressure of the environment exterior to the second compartment.

2. An apparatus according to claim 1, wherein a first depth in a direction perpendicular to the direction of movement of said moveable component of said second compartment is substantially equal to a second depth in the direction of the first compartment.

3. An apparatus according to claim 1 further comprising a plurality of second compartments nested about the first compartment.

4. An apparatus according to claim 3, wherein an outermost of the plurality of second compartments is, in use, at a lowest pressure.

5. An apparatus according to claim 1, wherein the moveable component is the substrate table.

6. An apparatus according to claims 1, wherein the moveable component is the support structure.

7. An apparatus according to claim 1, wherein the support structure comprises a mask table for holding a mask.

8. An apparatus according to claim 1, wherein the radiation system comprises a radiation source.

9. A method of manufacturing a device using a lithographic projection apparatus, the apparatus comprising:
   a radiation system constructed and arranged to provide a projection beam of radiation;

a support structure constructed and arranged to support a patterning device, the patterning device serving to pattern the projection beam according to a desired pattern;

a substrate table to hold a substrate;

a projection system constructed and arranged to project the patterned beam onto a target portion of the substrate, the method comprising:

providing a substrate that is at least partially covered by a layer of radiation-sensitive material;

providing a projection beam of radiation;

patterning the projection beam with a pattern in its cross-section;

projecting the patterned beam of radiation onto a target portion of the layer of radiation-sensitive material;

providing a first compartment at least partially enclosing and moving with a moveable component of said apparatus;

providing a second compartment at least partially enclosing and moving with the first compartment; and supplying purge gas to the first compartment and removing purge gas from the second compartment such that the first compartment is at an average pressure $P_1$ and the second compartment is at an average pressure $P_2$; whereby the pressures $P_1$, $P_2$ satisfy the inequalities $$P_1 > P_0$$

and $$P_2 < P_0,$$

wherein $P_0$ is the average pressure of the environment exterior to the second compartment.

10. A device manufactured according to the method of claim 9.

* * * * *